(12) United States Patent
Takeda et al.

(10) Patent No.: US 7,876,619 B2
(45) Date of Patent: Jan. 25, 2011

(54) NONVOLATILE SEMICONDUCTOR MEMORY DEVICE

(75) Inventors: Shinji Takeda, Yokohama (JP); Yoshiharu Hirata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 171 days.

(21) Appl. No.: 12/368,667

(22) Filed: Feb. 10, 2009

(65) Prior Publication Data

US 2009/0201737 A1    Aug. 13, 2009

(30) Foreign Application Priority Data

Feb. 13, 2008    (JP)    ............... 2008-031733

(51) Int. Cl.
*G11C 11/34*    (2006.01)
*G11C 16/04*    (2006.01)

(52) U.S. Cl. ............... 365/185.14; 365/185.17

(58) Field of Classification Search ............ 365/185.14, 365/185.17, 185.18
See application file for complete search history.

(56) References Cited

U.S. PATENT DOCUMENTS

| | | | |
|---|---|---|---|
| 7,023,731 B2 * | 4/2006 | Hamaguchi et al. .... | 365/185.14 |
| 7,158,413 B2 | 1/2007 | Kasai et al. | |
| 7,212,434 B2 | 5/2007 | Umezawa | |
| 7,263,003 B2 * | 8/2007 | Edahiro et al. ......... | 365/185.25 |
| 7,345,928 B2 * | 3/2008 | Li ......................... | 365/189.05 |
| 2007/0201299 A1 | 8/2007 | Kanda et al. | |

* cited by examiner

*Primary Examiner*—Anh Phung
(74) *Attorney, Agent, or Firm*—Turocy & Watson, LLP (57) ABSTRACT

A semiconductor memory device comprises: a write circuit including a latch circuit configured by two inverters having a positive side power supply terminal supplied with a first voltage and a negative side power supply terminal supplied with a second voltage; and a write state machine controlling the first and second voltages. When writing data to a memory cell, the first voltage is changed to a second value that is lower than a first value. When writing data to a memory cell, the second voltage is changed to a third value that is lower than the second value. The write state machine lowers the second voltage to an intermediate value between the second value and the third value and, while maintaining this intermediate value, lowers the first voltage from the first value to the second value.

19 Claims, 6 Drawing Sheets

WRITE OPERATION

NONVOLATILE SEMICONDUCTOR MEMORY DEVICE

CROSS-REFERENCE TO RELATED APPLICATIONS

This application is based on and claims the benefit of priority from prior Japanese Patent Application No. 2008-031733, filed on Feb. 13, 2008, the entire contents of which are incorporated herein by reference.

BACKGROUND OF THE INVENTION

1. Field of the Invention

The present invention relates to a nonvolatile semiconductor memory device.

2. Description of the Related Art

As conventional nonvolatile semiconductor memory, NOR flash memory and NAND flash memory have been widely used. In recent years, there has been proposed a flash memory (hereafter referred to as "2Tr flash memory") combining the advantages of both NOR flash memory and NAND flash memory. A memory cell in a 2Tr flash memory comprises two MOS transistors. One of the MOS transistors, serving as a nonvolatile memory section, comprises a stacked structure of a control gate and a floating gate and has its drain electrode connected to a bit line. The other MOS transistor has its source electrode connected to a source line and is used for selection of the memory cell.

The write operation in the 2Tr flash memory is described below. During write, a write voltage fed from a write circuit is applied to the drain electrode of the MOS transistor that serves as a memory section. The write voltage causes the charge to become a hot carrier and to be transferred to the floating gate of the "memory" MOS transistor. The state in which the threshold voltage of the memory cell is raised due to accumulation of the charge on the floating gate is the "0" data state. The "1" or "0" of the data is decided by the presence or absence of the charge in the floating gate.

The write circuit includes latch circuits, each latch circuit being formed of two inverters, each inverter being configured by an nMOS transistor and a pMOS transistor. The inverter has a positive side power supply terminal and a negative side power supply terminal. If the voltage applied to the positive side power supply terminal and that applied to the negative side power supply terminal become equal, the data latched in the inverters is destroyed.

As a method of solving this problem, Japanese Unexamined Patent Application Publication No. 2005-317138 proposes a method of controlling the applied voltage immediately before the write operation so that at first the voltage applied to the negative side power supply terminal is lowered, and then the voltage applied to the positive side power supply terminal is lowered. However, in this method, the voltage applied between the positive and negative side power supply terminals becomes large at the point of time when the voltage applied to the negative side power supply terminal is first lowered.

Furthermore, the negative voltage applied to the negative side power supply terminal of the inverter is supplied also to the substrate part of all memory cells. Consequently, there has been a problem that the above-described large voltage may be applied between the drain electrodes and substrate part of non-selected memory cells, giving rise to a weak write state and resulting in a faulty write operation.

SUMMARY OF THE INVENTION

In accordance with an aspect of the present invention, a nonvolatile semiconductor memory device comprises: a memory cell array including a plurality of memory cells holding data and arranged in an array; a plurality of bit lines to which a write voltage for executing a write of the data to the memory cells is applied; a write circuit including a latch circuit configured by two inverters having a positive side power supply terminal supplied with a first voltage and a negative side power supply terminal supplied with a second voltage, the write circuit configured to supply the write voltage to the bit lines; and a write state machine controlling the first voltage and the second voltage, the first voltage being changed from a first value to a second value that is lower than the first value on writing data to the memory cells, the second voltage being changed from the second value to a third value that is lower than the second value when writing data to the memory cells, and the write state machine being configured to control the first voltage and the second voltage to lower the second voltage to an intermediate value between the second value and the third value and, while maintaining this intermediate value for a certain time, lower the first voltage from the first value to the second value.

DETAILED DESCRIPTION OF THE EMBODIMENTS

A nonvolatile semiconductor memory device according to an embodiment of the present invention is now described on the basis of the drawings.

First Embodiment

Figure 1:
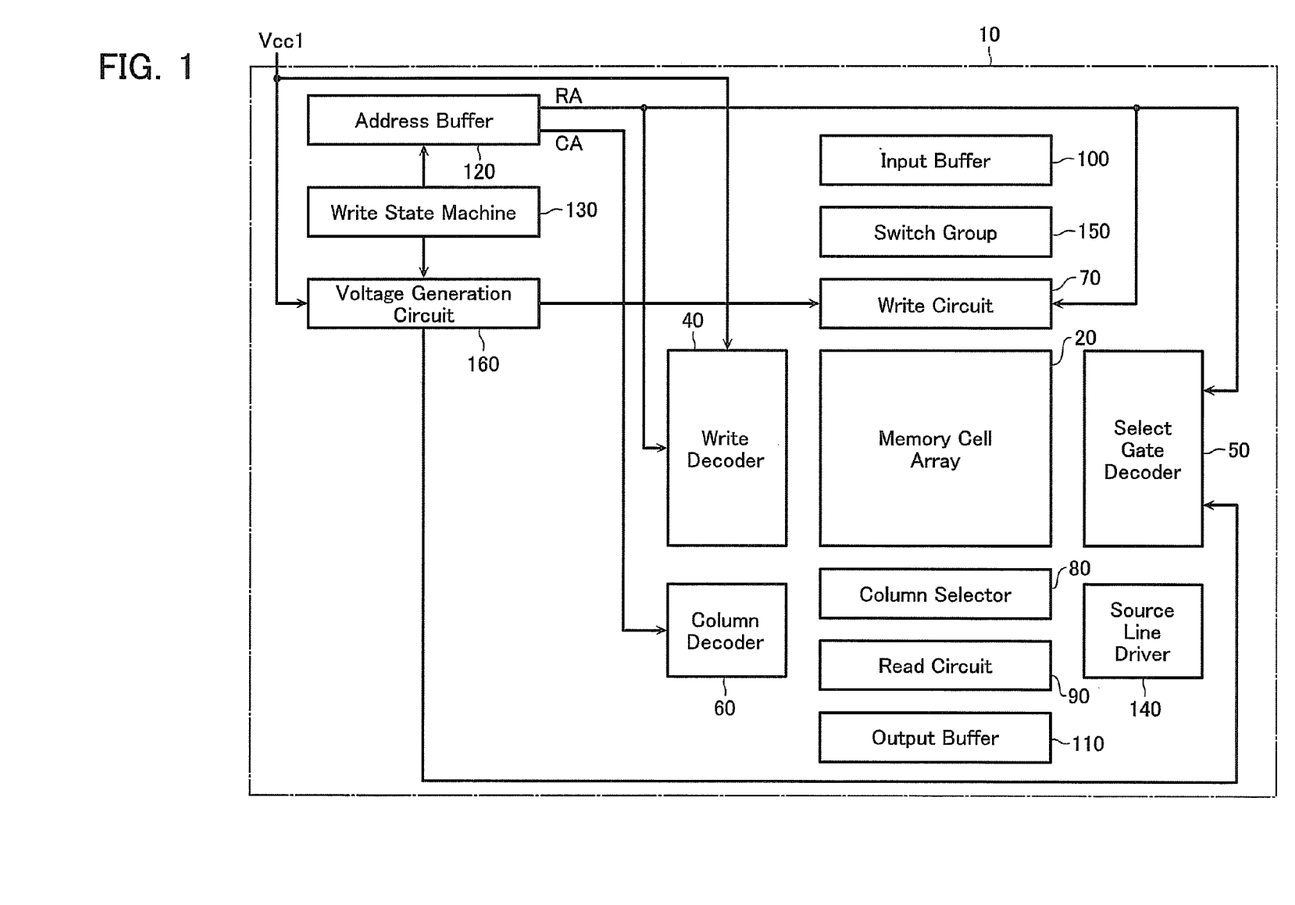
FIG. 1 is a configuration diagram of the main parts of a nonvolatile semiconductor memory device according to an embodiment of the present invention.

FIG. 1 is a block diagram showing a configuration of the main parts of a nonvolatile semiconductor memory device (hereafter referred to as "flash memory") 10 according to a first embodiment of the present invention.

The flash memory 10 comprises a memory cell array 20, a write decoder 40, a select gate decoder 50, a column decoder 60, a write circuit 70, a column selector 80, a read circuit 90, an input buffer 100, an output buffer 110, an address buffer 120, a write state machine 130, a source line driver 140, a switch group 150, and a voltage generation circuit 160. A voltage Vcc1 from exterior is applied to the voltage generation circuit 160.

Figure 2:
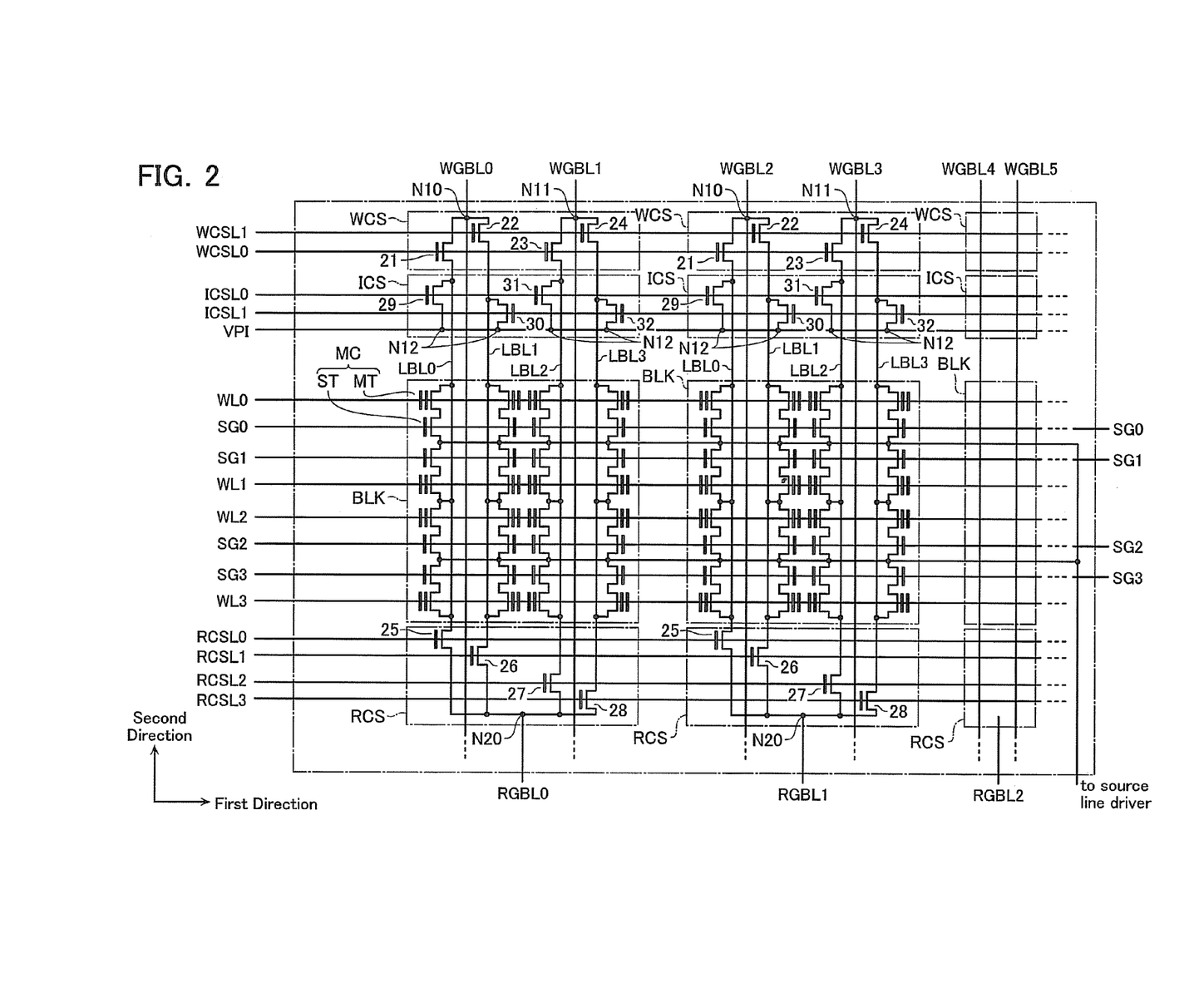
FIG. 2 is a circuit diagram of a memory cell array in the same nonvolatile semiconductor memory device.

The memory cell array 20 has a plurality of memory cells MC disposed as an array in a first direction and a second direction, as shown in FIG. 2.

As shown in FIG. 2, the memory cell array 20 has m×n memory cell blocks BLK (where m and n are natural numbers), together with a write column selector WCS, a read column selector RCS, and a write inhibit column selector ICS, all of which are provided to each of the memory cell blocks BLK. FIG. 2 shows only a single row of memory cell blocks BLK extending in the first direction.

Each memory cell block BLK includes a plurality of memory cells MC. Each memory cell MC has a memory cell transistor MT and a select transistor ST; and a source of the memory cell transistor MT is connected to a drain of the select transistor ST. The memory cell transistor MT is provided with a stacked gate structure having a floating gate formed on a semiconductor substrate with a gate insulator interposed, and a control gate formed above the floating gate with an intergate insulator interposed. Further, memory cells MC that are adjacent to each other in the second direction shown in FIG. 2 share a drain region of the memory cell transistor MT or a source region of the select transistor ST. In the case of FIG. 2, each memory cell block BLK includes (4×4) memory cells MC. Control gates of the memory cell transistors MT in the memory cells MC disposed in the first direction are commonly connected to one of word lines WL0-WL(4m-1) extending in the first direction.

Gates of the select transistors ST in the memory cells MC disposed in the first direction are commonly connected to one of select gate lines SG0-SG(4m-1) extending in the first direction.

Drains of the memory cell transistors MT of the four memory cells MC disposed in the second direction are commonly connected to one of first bit lines (hereafter referred to as "local bit lines") LBL0-LBL3 extending in the second direction. That is to say, the plurality of memory cells MC in the memory cell array 20 are configured so that each of the four memory cells MC disposed in the first direction is connected to one of local bit lines LBL0-LBL3.

One end of the local bit line LBL0 and one end of the local bit line LBL1 are commonly connected via transistors 21 and 22, respectively, to one of second bit lines (hereafter referred to as "write global bit lines") WGBL0-WGBL(2n-1).

In addition, one end of the local bit line LBL2 and one end of the local bit line LBL3 are commonly connected via transistors 23 and 24, respectively, to one of the write global bit lines WGBL0-WGBL(2n-1). Note that, although in the present embodiment the bit lines have a hierarchical structure of the write global bit lines WGBL and the local bit lines LBL, the present invention is not limited to this and is applicable also to a nonvolatile semiconductor memory device having bit lines without a hierarchical structure.

Other ends of local bit lines LBL0-LBL3 are commonly connected via transistors 25-28 to one of third bit lines (hereafter referred to as "read global bit lines") RGBL0-RGBL(n-1). Note that, although in the present embodiment the bit lines have a hierarchical structure of the read global bit lines RGBL and the local bit lines LBL on the read side also, the present invention is not limited to this and is applicable also to a nonvolatile semiconductor memory device having bit lines without a hierarchical structure on the read side.

The local bit lines LBL0-LBL3 are each connected to a write inhibit voltage nodes N12 via transistors 29-32, respectively.

Source electrodes of the select transistors ST of the memory cells MC are commonly connected, and connected to the source line driver 140.

Note that the number of the memory cells MC in a memory cell block BLK, the number of read global bit lines RGBL and the write global bit lines WGBL, and so on, are not limited to those shown in the present embodiment.

The configuration of the write column selector WCS is now described. Each write column selector WCS comprises four transistors 21-24. One end of a current pathway of the transistors 21-24 is connected to a respective one end of local bit lines LBL0-LBL3. Other ends of the current pathways of transistors 21 and 22 are commonly connected, and other ends of the current pathways of the transistors 23 and 24 are commonly connected. A common connection node of the transistors 21 and 22 is hereafter referred to as a node N10, and a common connection node of the transistors 23 and 24 is hereafter referred to as node N11. Gates of the transistors 21-24 are connected to one of write column select lines WCSL0-WCSL(2m-1) extending in the first direction. Note that the transistors 21, 23 included in the write column selectors WCS in the same row in the first direction are connected to an identical write column select line WCSL(i-1) (where i=1, 3, 5, . . . ); and that the transistors 22, 24 included in the write column selectors WCS in the same row in the first direction are connected to an identical write column select line WCSLi. The write column select lines WCSL0-WCSL (2m-1) are selected by the column decoder 60 during write.

Connected to the nodes N10, N11 in the write column selectors WCS is one of the write global bit lines WGBL0-WGBL(2n-1). The write global bit lines WGBL0-WGBL (2n-1) are connected to the write circuit 70.

The configuration of the read column selector RCS is now described. The read column selectors RCS each comprise four transistors 25-28. One end of a current pathway of the transistors 25-28 is connected to a respective other end of local bit lines LBL0-LBL3. And other ends of the current pathways of the transistors 25-28 are commonly connected to each other. A common connection node of the transistors 25-28 is hereafter referred to as a node N20. Gates of the transistors 25-28 are connected to different read column select lines RCSL0-RCSL(4m-1). Note that gates of the transistors 25-28 included in the read column selectors RCS in the same row in the first direction are connected to the identical read column select lines RCSL0-RCSL(4m-1). The read column select lines RCSL0-RCSL(4m-1) are selected by the column decoder 60 during read. Connected to the node N20 in the read column selectors RCS is one of the read global bit lines RGBL0-RGBL(n-1). The read global bit lines RGBL0-RGBL(n-1) are connected to the read circuit 90.

The input buffer 100 holds write data supplied by a CPU not shown.

Figure 3:
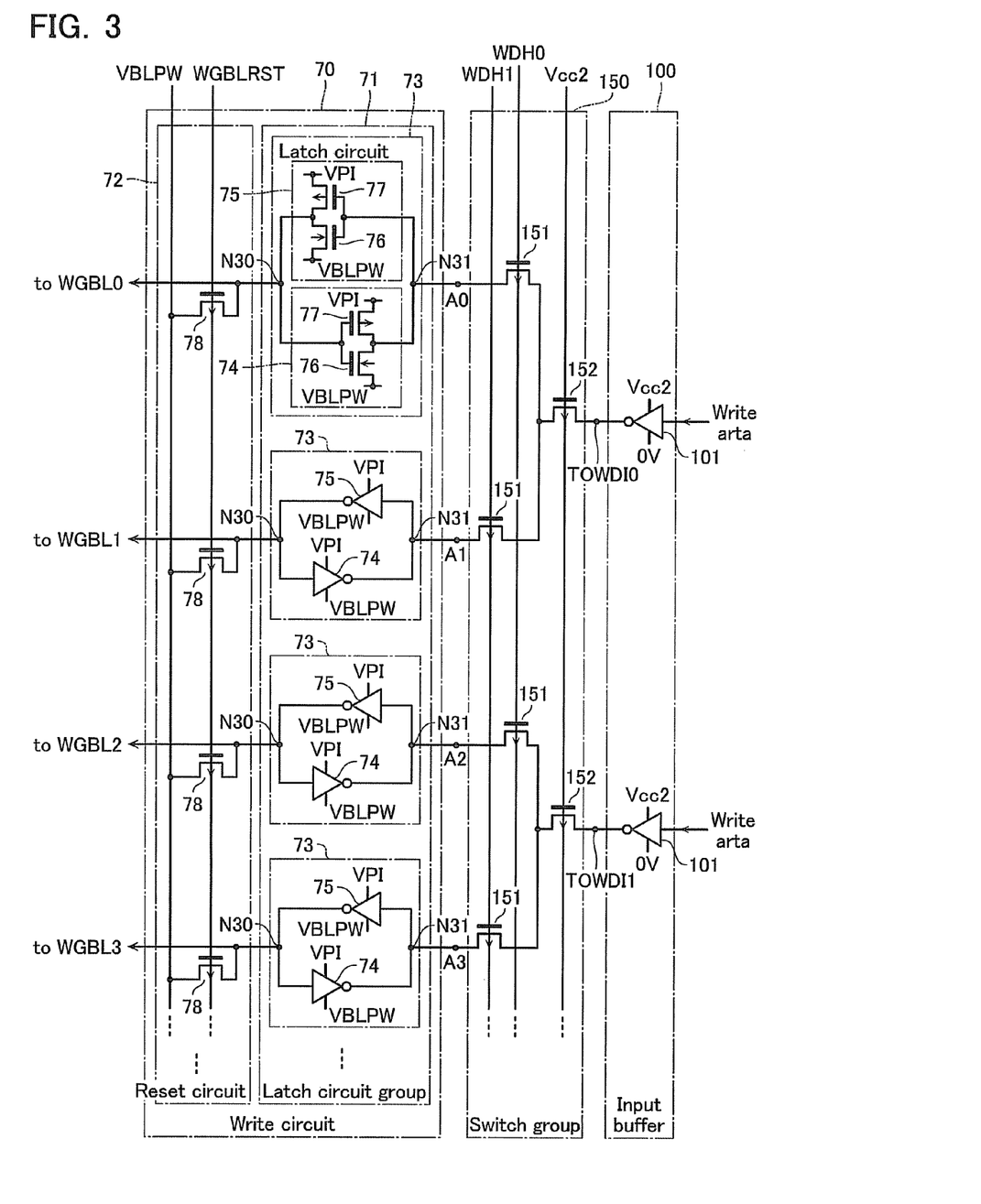
FIG. 3 is a circuit diagram of a write circuit, a switch group, and an input buffer in the same nonvolatile semiconductor memory device.

Configurations of the write circuit 70, the switch group 150, and the input buffer 100 are described using FIG. 3. FIG. 3 is a circuit diagram of the write circuit 70, the switch group 150, and the input buffer 100.

The write circuit 70 is described. The write circuit 70 comprises a latch circuit group 71 and a reset circuit 72. The latch circuit group 71 comprises latch circuits 73, one latch circuit 73 being provided to each of write global bit lines WGBL0-WGBL(2n-1).

Each latch circuit 73 comprises a first inverter 74 and a second inverter 75. An input terminal of the inverter 74 is connected to an output terminal of the inverter 75, and an output terminal of the inverter 74 is connected to an input terminal of the inverter 75. The connection node of the input terminal of the inverter 74 and the output terminal of the inverter 75 forms an output node N30 of the latch circuit 73, and is connected to a corresponding write global bit line WGBL.

The inverters 74, 75 respectively comprise an n-channel MOS transistor 76 and a p-channel MOS transistor 77, that have a serially connected current pathway. A source of the n-channel MOS transistor 76 (a negative power supply terminal of the inverter) is connected to a node VBLPW, and a source of the p-channel MOS transistor 77 (a positive power supply terminal of the inverter) is connected to a write inhibit voltage node VPI. A gate of the n-channel MOS transistor 76 and a gate of the p-channel MOS transistor 77 are commonly connected. In addition, the connection node of a drain of the p-channel MOS transistor 77 and a drain of the n-channel MOS transistor 76 in the inverter 75 is connected to the connection node N30 of the gate of the p-channel MOS transistor 77 and the gate of the n-channel MOS transistor 76 in the inverter 74. Further, the connection nodes N30 are connected to the write global bit lines WGBL0-WGBL(2n−1). In addition, the connection node of the drain of the p-channel MOS transistor 77 and the drain of the n-channel MOS transistor 76 in the inverter 74 is connected to a connection node N31 of the gate of the p-channel MOS transistor 77 and the gate of the n-channel MOS transistor 76 in the inverter 75. This connection node N31 forms an input node of the latch circuit 73.

The reset circuit 72 comprises n-channel MOS transistors 78, one n-channel MOS transistor being provided to each of write global bit lines WGBL0-WGBL(2n−1). A drain of each of the n-channel MOS transistor 78 is connected to a corresponding write global bit line WGBL, sources are commonly connected to a node VBLPW, and gates are commonly connected to a node WGBLRST.

The switch group 150 comprises n-channel MOS transistors 151 and n-channel MOS transistors 152, one n-channel MOS transistor 151 being provided to each of the latch circuits 73. One end of a current pathway of an n-channel MOS transistor 151 is connected to the input node N31 of a corresponding latch circuit 73. And, other ends of the current pathways of two n-channel MOS transistors 151 respectively connected to the adjacent latch circuits 73 are commonly connected. That is to say, the n-channel MOS transistors 151 connected to the latch circuits 73 that respectively correspond to the write global bit lines WGBL0 and WGBL1 share the other end of their current pathways with each other. The n-channel MOS transistors 151 connected to the latch circuits 73 that respectively correspond to write global bit lines WGBL2 and WGBL3 also do likewise.

Further, gates of n-channel MOS transistors 151 connected to the latch circuits 73 corresponding to write global bit lines WGBL(i−1) (where i=1, 3, 5, . . . ) are commonly connected to node WDH0; and gates of n-channel MOS transistors 151 connected to the latch circuits 73 corresponding to write global bit lines WGBLi are commonly connected to a node WDH1. Also, the other ends of the current pathways of the n-channel MOS transistors 151 commonly connected to each other are connected to one end of a current pathway of the n-channel MOS transistor 152. A positive voltage Vcc2 (≈3 V) is applied collectively to gates of the n-channel MOS transistors 152. The positive voltage Vcc2 is generated by the voltage generation circuit 160, for example. Note that connection nodes of the n-channel MOS transistors 151 and the input nodes N31 of the latch circuits 73 are hereafter respectively referred to as nodes A0-A(2n−1).

The input buffer 100 is now described. The input buffer 100 comprises an inverter 101 provided to each of the n-channel MOS transistors 152 in the switch group 150. An input node of the inverter 101 is inputted with write data supplied from a CPU not shown, and an output node is connected to another end of the current pathway of the n-channel MOS transistor 152. The inverter 101 operates with a high voltage side power supply potential set to Vcc2, and a low voltage side power supply potential set to 0 V. Connection nodes of the output nodes of the inverters 101 and n-channel MOS transistors 152 are hereafter respectively referred to as nodes TOWDI0-TOWDI((2n−1)/2).

The description continues, returning to FIG. 1.

The column decoder 60 decodes a column address signal to obtain a column address decode signal CA. The operation to select column select lines WCSL, RCSL, and ICSL is effected on the basis of this column address decode signal CA.

The column selector 80 selects one of read global bit lines RGBL0-RGBL(n−1) during read, on the basis of the above-described column address decode signal CA.

The read circuit 90 pre-charges the read global bit lines RGBL0-RGBL(n−1) during read. It then amplifies data read out from the read global bit lines RGBL0-RGBL(n−1). The amplified read data is sent to exterior of the flash memory 10 via the output buffer 110.

The description continues, returning to FIG. 1.

The source line driver 140 supplies a voltage to a source line SL.

The address buffer 120 holds an address signal supplied from a CPU not shown. It then supplies a column address signal CA to the column decoder 60, and a row address signal RA to the write decoder 40, the select gate decoder 50, and the write circuit 70.

The write state machine 130 controls operations of each circuit included in the flash memory 10, effects timing control for write, erase, and read of data, and executes predefined algorithms determined for each operation, based on instruction signals supplied from a CPU not shown.

The voltage generation circuit 160 generates a plurality of internal voltages based on a voltage Vcc1 (for example, 1.25-1.65 V) inputted from exterior. The voltage generation circuit 160 comprises a negative charge pump circuit 161 and a positive charge pump circuit 162. It generates negative voltages VBB1 (−6 V), VBB2 (−2.5 V), and positive voltages VPP1 (10 V), Vcc2 (3 V).

The write decoder 40 selects one of word lines WL0-WL(4m−1) and applies the positive potential VPP1 (10 V) to the selected word line WL during write. It then applies the negative potentials VBB1 (−6 V), VBB2 (−2.5 V) to a well region VPW formed in the memory cell array 20. Moreover, during erase, the write decoder 40 applies the negative potential VBB1 to all word lines WL0-WL(4m−1), and applies the positive potential VPP1 to the well region VPW.

The select gate decoder 50 selects one of select gate lines SG0-SG(4m−1) and applies the positive potential Vcc2 to the selected select gate line during read.

Figure 4:
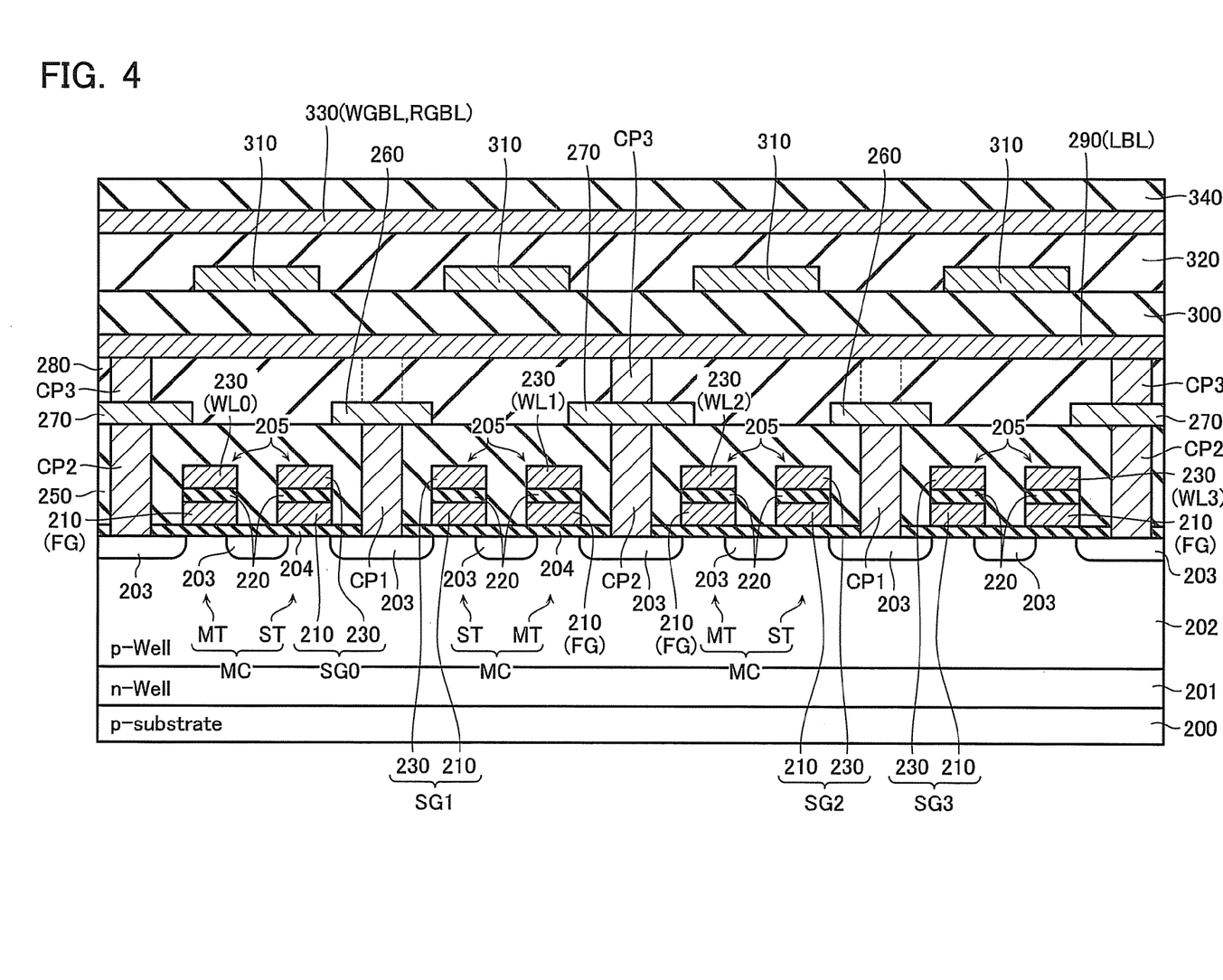
FIG. 4 is a partial cross-sectional view taken along a bit line of the same nonvolatile semiconductor memory device.

Cross-sectional structure of a memory cell array 20 provided to the flash memory 10 with the above-described configuration is now described using FIG. 4. FIG. 4 is a cross-sectional view taken along a bit line direction of the memory cell array 20.

The figure shows the following. Formed in a surface region of a p-type semiconductor substrate 200 is an n-type well region 201, and formed in a surface region of the n-type well region 201 is a p-type well region 202. Formed on an element region of the p-type well region 202 is a gate insulator 204, and formed on the gate insulator 204 are gate electrodes 205 of memory cell transistors MT and select transistors ST. The gate electrodes 205 of the memory cell transistors MT and the select transistors ST include a polycrystalline silicon layer 210 formed on the gate insulator 204, an inter-gate insulator 220 formed on the polycrystalline silicon layer 210, and a polycrystalline silicon layer 230 formed on the inter-gate insulator 220. The inter-gate insulator 220 is formed by a silicon oxide film, an ON film/NO film/ONO film having a laminated structure of silicon oxide and silicon nitride, or the like.

In the memory cell transistors MT, the polycrystalline silicon layers 210 are mutually isolated by an inter-element region of adjacent elements and function as floating gates (FG). On the other hand, the polycrystalline silicon layers 230 are commonly connected by an inter-element region of adjacent elements and function as control gates (word lines WL).

In the select transistors ST, the polycrystalline silicon layers 210 are commonly connected by an inter-element region of adjacent elements; the polycrystalline silicon layers 230 are commonly connected by an inter-element region of adjacent elements; and the polycrystalline silicon layers 210, 230 function as select gate lines SG. However, it is only the polycrystalline silicon layers 210 that actually function as select gate lines.

Further, formed in a surface of the p-type well region 202 positioned between adjacent gate electrodes 205 are impurity diffusion layers 203. The impurity diffusion layers 203 are shared by adjacent transistors. As previously described, memory cells MC that include a memory cell transistor MT and a select transistor ST are formed having the following relationship. That is to say, select transistors ST of adjacent memory cells MC, or memory cell transistors MT of adjacent memory cells MC lie next to each other. And such adjacent transistors share an impurity diffusion layer 203. Consequently, when the select transistors ST of adjacent two memory cells MC are arranged adjacent to each other, the two select transistors ST are disposed symmetrically centering around a shared impurity diffusion layer (source region) 203. Likewise, when the memory cell transistors MT of adjacent two memory cells MC are arranged adjacent to each other, the two memory cell transistors MT are disposed symmetrically centering around a shared impurity diffusion layer (drain region) 203.

Further, an inter-layer insulator 250 is formed on the p-type well region 202 so as to cover the above-mentioned memory cell transistors MT and select transistors ST. Formed within the inter-layer insulator 250 is a contact plug CP1 that reaches the impurity diffusion layer (source region) 203 shared by the two select transistors ST. And formed on the inter-layer insulator 250 is a metal line layer 260 connected to the contact plug CP1. The metal line layer 260 functions as a source line SL. Additionally formed within the inter-layer insulator 250 is a contact plug CP2 that reaches the impurity diffusion layer (drain region) 203 shared by the two memory cell transistors MT. And further formed on the inter-layer insulator 250 is a metal line layer 270 connected to the contact plug CP2.

An inter-layer insulator 280 is formed on the inter-layer insulator 250 so as to cover the metal line layers 260 and 270. And formed within the inter-layer insulator 280 is a contact plug CP3 that reaches the metal line layer 270. Further formed on the inter-layer insulator 280 is a metal line layer 290 commonly connected to a plurality of contact plugs CP3. The metal line layer 290 functions as one of the local bit lines LBL0-LBL3. In addition, formed within the inter-layer insulator 280 is a contact plug that reaches the metal line layer 260; a plurality of source lines 260 are commonly connected by this contact plug in a region not shown.

An inter-layer insulator 300 is formed on the inter-layer insulator 280 so as to cover the metal line layer 290. And formed on the inter-layer insulator 300 is a metal line layer 310. The metal line layer 310 is connected to the polycrystalline silicon layer 210 of select transistors ST in a shunt region not shown and functions as a shunt line of a select gate line. A distance between lines of the metal line layer 310 is set to be equal. Note that in the shunt region at least a portion of the polycrystalline silicon layer 230 of select transistors ST is removed, and the shunt line 310 and the polycrystalline silicon layer 210 are connected by way of a contact plug (not shown) formed in the region of this removal. The shunt line 310 and the polycrystalline silicon layer 230 are electrically isolated.

Further, an inter-layer insulator 320 is formed on the inter-layer insulator 300 so as to cover the metal line layer 310. Formed on the inter-layer insulator 320 are a metal line layer 330 that functions as a write global bit line and read global bit line, and additionally an inter-layer insulator 340.

Figure 5:
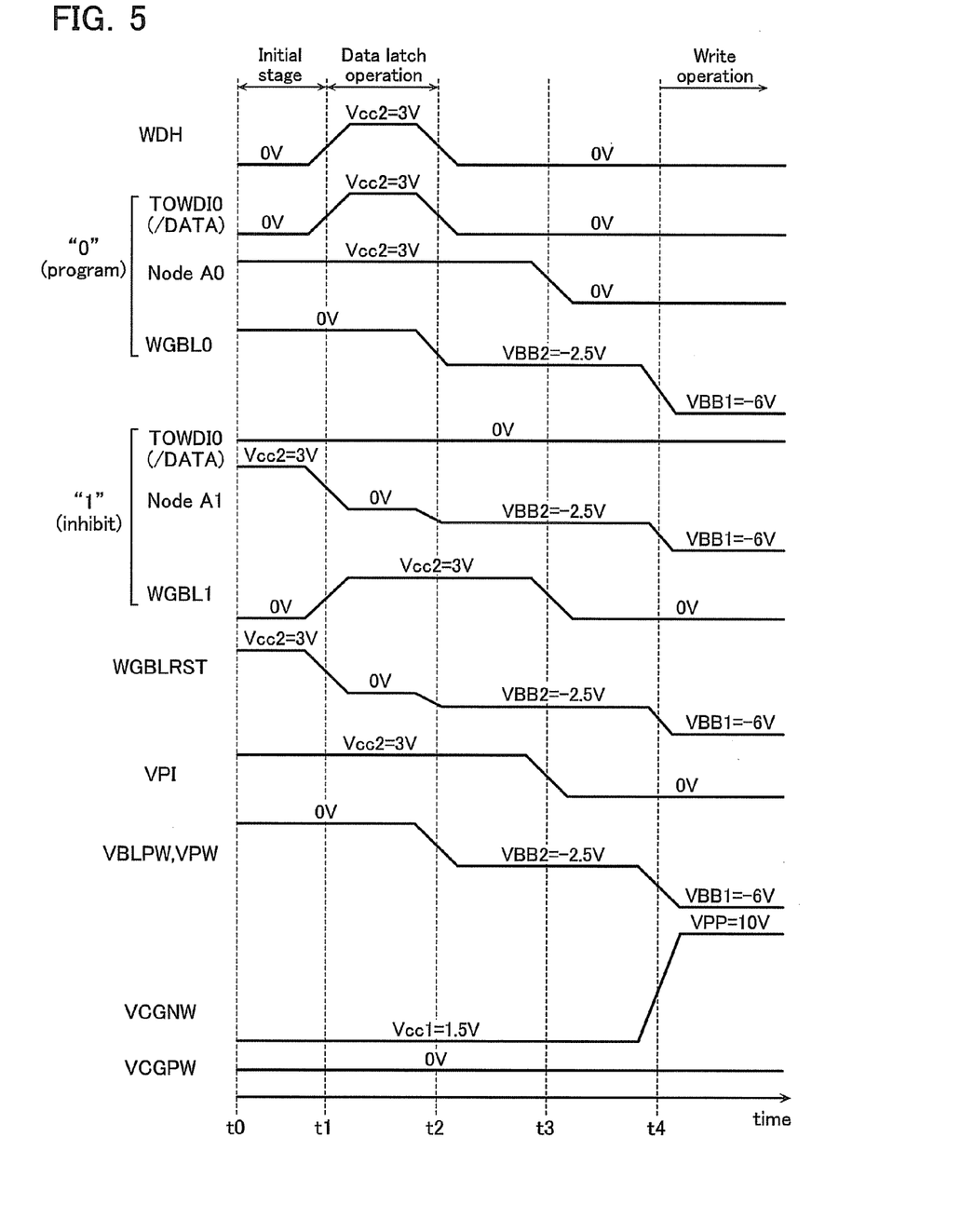
FIG. 5 is a timing chart showing an initial stage operation, a data latch operation, and a write operation of the same nonvolatile semiconductor memory device.

Operation of the aforementioned flash memory 10 is now described below using FIG. 5. FIG. 5 is a timing chart of voltages of each signal and each node.

Note that, hereafter, a state where electrons are not injected into a floating gate of a memory transistor MT and a threshold voltage is negative is defined as a state where a "1" data is written; on the other hand, a state where electrons are injected into a floating gate and a threshold voltage is positive is defined as a state where a "0" data is written.

In addition, to simplify description, operation is described taking as an example a case of a memory cell array 10 that includes two write global bit lines WGBL0 and WGBL1, and one read global bit line RGBL0.

First, an initial stage operation is described using FIGS. 3 and 5. The initial stage operation refers to an operation initially effected when undertaking write, read, erase, and so on, of data. The initial stage operation is effected in the period from time t0 to t1 in FIG. 5.

First in undertaking the initial stage operation, the node WDH0 and node WDH1 are applied with an "L" level (0 V). As a result, the n-channel MOS transistors 151 in the switch group 150 are set to an "off" state, and the write circuit 70 and the input buffer 100 are electrically isolated. In addition, the write inhibit voltage VPI applied as a high voltage power supply voltage in the latch circuits 73 is set to Vcc2, and VBLPW in latch circuits 73 is set to 0 V. Further, the node WGBLRST is applied with an "H" level (Vcc2), so that all write global bit lines WGBL0 and WGBL1 are reset. That is to say, the n-channel MOS transistors 78 in the write circuit 70 are set to an "on" state, and the write global bit lines WGBL0 and WGBL1 are applied with the 0 V from the node VBLPW. As a result, the output nodes N30 of all of the latch circuits 73 take an "L" level (0 V), and the input nodes N31, and the nodes A0 and A1 take an "H" level (Vcc2).

In this way, in the initial stage operation, the write global bit lines WGBL0 and WGBL1 are set to 0 V, and the nodes A0 and A1 are set to Vcc2, as described above.

Next, a data latch operation is described using FIGS. 3 and 5. The data latch operation refers to an operation that inputs write data to individual latch circuits 73 when undertaking write of data. The data latch operation is effected between times t1 and t2 in FIG. 5. Hereafter, an example is taken of a case where "0" data is written to a memory cell connected to write global bit line WGBL0 (WGBL0 is in "select" state), and "1" data is written to a memory cell connected to write global bit line WGBL1 (WGBL1 is in "non-select" state), and a description provided thereof.

First, a case where "0" data is inputted is described. In the data latch operation, the node WGBLRST is applied with 0 V, so that the n-channel MOS transistors 78 are set to an "off" state. As a result, each of the write global bit lines WGBL0 and WGBL1 is electrically isolated from the node VBLPW (0 V). Furthermore, to latch data in the latch circuit 73 corresponding to the write global bit line WGBL0, node WDH0 is applied with an "H" level (Vcc2), so that the n-channel MOS transistor 151 corresponding to the write global bit line WGBL0 is set to an "on" state. On the other hand, the n-channel MOS transistor 151 corresponding to the write global bit line WGBL1 is set to an "off" state. Consequently, the input buffer 100 and the latch circuit 73 corresponding to the write global bit line WGBL0 are electrically connected.

Further, "0" data is inputted to the inverter 101 of the input buffer 100 from a CPU not shown. During inputting of the "0" data, an input node of the inverter 101 is applied with 0 V. The "0" data is inverted by the inverter 101. As a result, the potential of the node TOWDI0 becomes Vcc2. And, since the gate of the n-channel MOS transistor 152 is applied with Vcc2, the n-channel MOS transistor 152 attains a "cut-off" state. Consequently, the latch circuit 73 continues to hold the data assigned at time t0 to t1. That is to say, the node A0 remains at Vcc2, and the write global bit line WGBL0 remains at 0 V.

Next, a case of inputting "1" data is described. It differs from the case of inputting "0" data in the point that, by setting WDH0=0 and WDH1=Vcc2, the n-channel MOS transistor 151 corresponding to the write global bit line WGBL1 is set to an "on" state.

Further, "1" data is inputted to the input buffer 100 from a CPU not shown. During inputting of the "1" data, an input node of the inverter 101 is applied with Vcc2. Consequently, the potential of node TOWDI0 becomes 0 V. This potential of the node TOWDI0 is inputted to the latch circuit 73 via the circuit pathway of the n-channel MOS transistor 151. As a result, the potential of the node A1 is inverted from Vcc2 to 0 V, and the potential of the write global bit line WGBL1 is inverted from 0 V to Vcc2.

In the data latch operation, data in a latch circuit corresponding to a memory cell MC executing a "1" write is inverted from its initial stage state, as described above. That is to say, when making a "0" write (electrons injected), data is not substantively inputted from exterior; when making a "1" write (electrons not injected), data is loaded from exterior.

Figure 6:
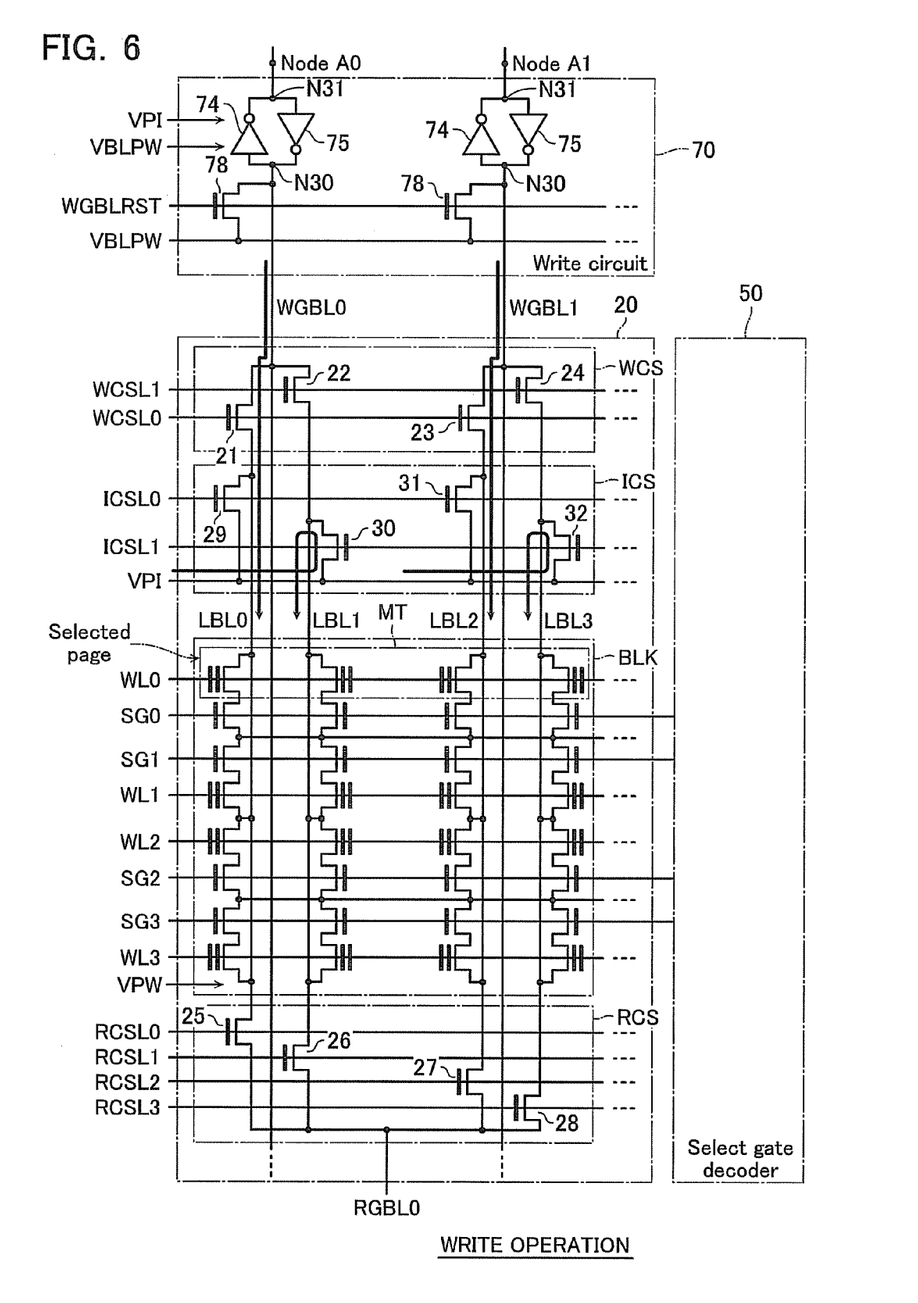
FIG. 6 is a circuit diagram showing a write operation of the same nonvolatile semiconductor memory device.

Next, a write operation is described using FIG. 6. Data write is executed collectively on all memory cell blocks BLK in the same row of the first direction. However, there are two memory cells MC within each of the memory cell block BLK that are simultaneously written to, namely, the memory cell MC connected to either of the local bit lines LBL0 and LBL1, and the memory cell MC connected to either of the local bit lines LBL2 and LBL3.

Setup for the write operation is effected in the period between times t2 and t4 in FIG. 5. FIG. 6 is a circuit diagram of a part of the memory cell array 20 and the write circuit 70 during the write operation. In FIG. 6, data is to be written to the memory cell transistors MT connected to the word line WL0 and the local bit lines LBL0 and LBL2. Of those memory cell transistors MT, "0" data is to be written to the memory cell transistor MT connected to the local bit line LBL0, and "1" data is to be written to the memory cell transistor MT connected to the local bit line LBL2.

First in the write operation, the node WGBLRST is set to 0V. At time t2, the node VBLPW of the low voltage side power supply voltage of the inverters 74 and 75 in the latch circuit 73, and the potential of the p-type well region 202 where the memory cell MC is formed (VPW) change from 0 V to VBB2 (−2.5 V). This VBB2 is an intermediate value between an initial value of 0 V and a final value of −6 V; provided that it is an intermediate value, it need not necessarily be −2.5 V.

Next, at time t3, the high voltage side power supply voltage VPI of the inverters 74 and 75 in the latch circuit 73 changes from Vcc2 (3 V) to 0 V. Subsequently, at time t4, the node VBLPW, and the potential of the p-type well region 202 (VPW) change from VBB2 (−2.5 V) to VBB1 (−6 V). The negative potentials VBB1 and VBB2 are outputted by the voltage generation circuit 160 under instructions of the write state machine 130. Note that, at time t3, the high voltage side power supply voltage VPI need not be changed to 0 V, and may be changed to another negative potential instead.

Due to the above-described operations, the potential of node A0 also changes from Vcc2 to 0 V at time t3. In addition, the potential of the node A1 also changes from 0 V to VBB2 (−2.5 V) at time t2, and further changes from VBB2 (−2.5 V) to VBB1 (−6 V) at time t4. The potential of the write global bit line WGBL0 changes from 0 V to VBB2 (−2.5 V) at time t2, and changes from VBB2 (−2.5 V) to VBB1 (−6 V) at time t4. Further, the potential of the write global bit line WGBL1 changes from Vcc2 to 0 V at time t3.

In addition, the column decoder 60 selects the write column select line WCSL0. Thereby, the MOS transistors 21 and 23 in the write column selector are set to an "on" state. As a result, the write global bit line WGBL0 and the local bit line LBL0 are electrically connected, and the write global bit line WGBL1 and the local bit line LBL2 are electrically connected.

Moreover, the column decoder 60 sets to non-select all write column select lines WCSL connected to the write column selector WCS corresponding to the memory cell block BLK that do not include the selected word line WL0. Consequently, the MOS transistors 21-24 in the write column selector WCS corresponding to the memory cell block BLK that do not include the selected word line WL0 are set to an "off" state.

Furthermore, the column decoder 60 sets to non-select all read column select lines RCSL0-RCSL(4m−1). Thereby, all the MOS transistors 25-28 in the read column selector RCS are set to an "off" state. Consequently, the read global bit line RGBL and the local bit lines LBL0-LBL3 are electrically isolated.

Furthermore, to set to an "on" state the MOS transistors 30 and 32 connected to non-selected local bit lines LBL1 and LBL3, the write inhibit column select line ICSL1 is set to an "H" level (Vcc2). As a result, the non-selected local bit lines LBL1 and LBL3 are applied with the write inhibit voltage VPI=0V. Note that the write inhibit column select line ICSL0 connected to the MOS transistors 29 and 31 corresponding to the selected local bit lines LBL0 and LBL2 is set to an "L" level, so that the MOS transistors 29 and 31 are in an "off" state.

As a result of the above, at time t2 the write voltage VBB2 is provided from the write global bit line WGBL0 to the local bit line LBL0 via the MOS transistor 21 in the write column selector WCS, and at time t4 VBB1 is provided. In addition, at time t3 the write inhibit voltage VPI is provided from the write global bit line WGBL1 to local bit line LBL2 via the MOS transistor 23. Summarizing the above, at time t2 the potential of local bit line LBL0 changes from 0 V to VBB2 (−2.5 V), and at time t4 from VBB2 (−2.5 V) to VBB1 (−6 V). And at time t3 the potential of the local bit lines LBL1-LBL3 changes from Vcc2 to 0 V.

Further, the write decoder 40 selects the word line WL0 and applies the positive voltage VPP1 (10 V) to the selected word line WL0; and the select gate decoder 50 applies the negative potential VBB1 (−6 V) to all of the select gate lines SG0-SG (4m−1).

As a result, at time t4, the memory cell transistor MT connected to the write global bit line WGBL1 and word line WL0 has an insufficient potential difference between its gate and drain, so that electrons are not injected into its floating gate. That is to say, the memory cell MC maintains a negative threshold value, and is written with "1" data. In addition, the memory cell transistors MT connected to non-selected local bit lines LBL1 and LBL3 and word line WL0 have VPI applied to their drains, so that electrons are not injected into their floating gates also, and the memory cells hold their negative threshold value. On the other hand, the memory cell transistor MT connected to the write global bit line WGBL0 and the word line WL0 has a sufficient potential difference between its gate and drain, so that electrons are injected into its floating gate by a Fowler-Nordheim (FN) tunneling current. As a result, a threshold value of the memory cell transistor MT changes to positive; that is to say, it is written with "0" data. In accordance with the above, data is collectively written to a page of memory cell transistors MT.

During data write with a conventional voltage control system, the voltage VPI of the positive side power supply terminal of a latch circuit is maintained at 3 V, and while it is being so maintained, the voltage VBLPW of the negative side power supply terminal of the latch circuit 73 changes from 0 V to −6 V. Subsequently, the voltage VPI also changes from Vcc2 (3 V) to 0 V. By staggering the timing of voltage changes in this way, destruction of data in the latch circuit 73 can be avoided. However, at the point in time that the voltage VBLPW of the negative side power supply terminal is changed from 0 V to −6 V, a potential difference between the voltage VPI and the voltage VBLPW becomes large.

The voltage VPI is supplied to drains of non-selected memory cells MC; and at the same time, the voltage VBLPW is supplied to the substrate part of all memory cells MC. Consequently, the potential difference between drain and substrate part in non-selected memory cells MC becomes large, and there is a risk that miswrites may occur.

On the other hand, with the method of the present embodiment, the voltage VBLPW once becomes an intermediate value −2.5 V at time t2, as shown in FIG. 5. Subsequently, and after the voltage VPI has fallen from 3 V to 0 V at time t3, the voltage VBLPW attains a final value of −6 V. In the period t2 to t3, the difference between voltages VBLPW and VPI is small; consequently, the potential difference between drain and substrate part in non-selected memory cells MC is also small, so that the risk of miswrites occurring can be reduced. Also, naturally, destruction of data in latch circuits 73 does not occur. Meanwhile, between times t3 and t4, the voltage VPI becomes 0 V, so that a data write operation can be executed similarly to conventional technology.

This concludes description of embodiments of the present invention, but it should be noted that the present invention is not limited to the above-described embodiments, and that various alterations, additions, and so on, are possible within a range not departing from the scope and spirit of the invention. For example, in the above-described embodiments, when switching the potential of VBLPW from 0 V to −6 V, an intermediate value of −2.5 V was maintained, but there is no need for the intermediate value to take this specific value, and it can take an altered value provided this lies between 0 V and −6 V. Furthermore, there is no need for there to be only one intermediate value; changing the potential of VBLPW stepwise to two intermediate values also falls within the scope and spirit of the present invention.

What is claimed is:

1. A nonvolatile semiconductor memory device, comprising:
a memory cell array including a plurality of memory cells holding data and arranged in an array;
a plurality of bit lines to which a write voltage for executing a write of the data to the memory cells is applied;
a write circuit including a latch circuit configured by two inverters having a positive side power supply terminal supplied with a first voltage and a negative side power supply terminal supplied with a second voltage, the write circuit configured to supply the write voltage to the bit lines; and
a write state machine controlling the first voltage and the second voltage,
the first voltage being changed from a first value to a second value that is lower than the first value on writing data to the memory cells,
the second voltage being changed from the second value to a third value that is lower than the second value when writing data to the memory cells, and
the write state machine being configured to control the first voltage and the second voltage to lower the second voltage to an intermediate value between the second value and the third value and, while maintaining this intermediate value for a certain time, lower the first voltage from the first value to the second value.

2. The nonvolatile semiconductor memory device according to claim 1,
wherein the write state machine executes control so as to maintain the second voltage at the intermediate value until the first voltage falls to the second value.

3. The nonvolatile semiconductor memory device according to claim 1,
wherein the latch circuit comprises a first inverter and a second inverter,
wherein an output terminal of the first inverter is connected to an input terminal of the second inverter and an output terminal of the second inverter is connected to an input terminal of the first inverter, and
wherein the first and second inverters are both configured by a first transistor and a second transistor with a serially connected current pathway.

4. The nonvolatile semiconductor memory device according to claim 1,
wherein the memory cells comprise: a memory cell transistor having a stacked structure of a charge accumulating layer and a control gate; and a select transistor serially connected to the memory cell transistor.

5. The nonvolatile semiconductor memory device according to claim 1, further comprising a reset circuit resetting the potential of the bit lines to a predetermined potential.

6. The nonvolatile semiconductor memory device according to claim 1, further comprising a write inhibit column selector supplying a write inhibit voltage to non-selected bit lines.

7. The nonvolatile semiconductor memory device according to claim 1, wherein the bit lines comprise: a plurality of local bit lines connected to the memory cells; and a plurality of global bit lines each connected to each of the plurality of local bit lines.

8. The nonvolatile semiconductor memory device according to claim 7, further comprising a write column selector selectively connecting the local bit lines to the global bit lines.

9. The nonvolatile semiconductor memory device according to claim 7, further comprising a reset circuit resetting a potential of the global bit lines to a predetermined potential.

10. The nonvolatile semiconductor memory device according to claim 7, further comprising a write inhibit column selector supplying a write inhibit voltage to non-selected local bit lines.

11. The nonvolatile semiconductor memory device according to claim 7, further comprising: a write column selector selectively connecting the local bit lines to the global bit lines; and a write inhibit column selector supplying a write inhibit voltage to non-selected local bit lines.

12. The nonvolatile semiconductor memory device according to claim 11, further comprising a reset circuit resetting the potential of the global bit lines to a predetermined potential.

13. The nonvolatile semiconductor memory device according to claim 7, wherein the memory cells comprise: a memory cell transistor having a stacked structure of a charge accumulating layer and a control gate; and a select transistor serially connected to the memory cell transistor.

14. The nonvolatile semiconductor memory device according to claim 1,
wherein the bit lines comprise: a plurality of local bit lines connected to the memory cells; a plurality of write global bit lines connected to the plurality of local bit lines during data write; and a plurality of read global bit lines connected to the plurality of local bit lines during data read.

15. The nonvolatile semiconductor memory device according to claim 14, further comprising a write column selector selectively connecting the local bit lines to the write global bit lines.

16. The nonvolatile semiconductor memory device according to claim 14, further comprising a reset circuit resetting the potential of the write global bit lines to a predetermined potential.

17. The nonvolatile semiconductor memory device according to claim 14, further comprising a write inhibit column selector supplying a write inhibit voltage to non-selected local bit lines.

18. The nonvolatile semiconductor memory device according to claim 14, further comprising: a write column selector selectively connecting the local bit lines to the write global bit lines; and a write inhibit column selector supplying a write inhibit voltage to non-selected local bit lines.

19. The nonvolatile semiconductor memory device according to claim 14,
wherein the memory cells comprise: a memory cell transistor having a stacked structure of a charge accumulating layer and a control gate; and a select transistor serially connected to the memory cell transistor.

* * * * *